(12) United States Patent
Martens et al.

(10) Patent No.: US 8,508,711 B2
(45) Date of Patent: Aug. 13, 2013

(54) LITHOGRAPHIC APPARATUS AND DEVICE MANUFACTURING METHOD

(75) Inventors: Arjan Hubrecht Josef Anna Martens, Valkenburg (NL); Martinus Cornelis Maria Verhagen, Valkenswaard (NL); Pieter Jacob Kramer, Veldhoven (NL); Hubertus Leonardus Franciscus Heusschen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 712 days.

(21) Appl. No.: 12/544,391

(22) Filed: Aug. 20, 2009

(65) Prior Publication Data

US 2010/0045951 A1    Feb. 25, 2010

Related U.S. Application Data

(60) Provisional application No. 61/136,273, filed on Aug. 22, 2008.

(51) Int. Cl.
    *G03B 27/52* (2006.01)
(52) U.S. Cl.
    USPC .......................................................... 355/30
(58) Field of Classification Search
    USPC .................................................... 355/53, 30
    See application file for complete search history.

(56) References Cited

U.S. PATENT DOCUMENTS

| 4,509,852 A | 4/1985 | Tabarelli et al. |
| 2004/0136494 A1 | 7/2004 | Lof et al. |
| 2004/0207824 A1 | 10/2004 | Lof et al. |
| 2005/0046813 A1* | 3/2005 | Streefkerk et al. ............. 355/30 |
| 2006/0028627 A1* | 2/2006 | Box ................................. 355/30 |
| 2007/0146664 A1* | 6/2007 | Zaal et al. ....................... 355/53 |
| 2007/0211233 A1* | 9/2007 | Van De Kerkhof et al. .... 355/30 |
| 2009/0135385 A1* | 5/2009 | Gellrich et al. ................. 355/30 |
| 2010/0141912 A1* | 6/2010 | Ehrmann et al. ............... 355/30 |

FOREIGN PATENT DOCUMENTS

| EP | 1 420 300 A2 | 5/2004 |
| JP | 2000-507750 | 6/2000 |
| JP | 2005-315707 | 11/2005 |
| JP | 2006-501793 | 1/2006 |
| JP | 2006-303295 | 11/2006 |
| WO | WO 99/49504 A1 | 9/1999 |
| WO | 2007/066582 | 6/2007 |

OTHER PUBLICATIONS

Japanese Office Action mailed Aug. 24, 2011 in corresponding Japanese Patent Application No. 2009-187914.

* cited by examiner

*Primary Examiner* — Peter B Kim
*Assistant Examiner* — Deoram Persaud
(74) *Attorney, Agent, or Firm* — Pillsbury Winthrop Shaw Pittman LLP

(57) ABSTRACT

A temperature sensor is provided to measure the temperature of immersion liquid at a position where the immersion liquid is supplied. The reading of this temperature sensor is used to control the magnitude of heat input to the immersion liquid using a heater and/or cooler. A controller is used to calculate the calibration error of the temperature sensor relative to a temperature sensor that is provided upstream. The controller uses readings of the temperature difference between the two temperature sensors at one or more mass flow rates in order to estimate the temperature difference between the two temperature sensors at an infinite mass flow rate. The temperature difference at this infinite mass flow rate is estimated to be the temperature calibration error of the temperature sensor to measure the temperature of immersion liquid at a position where the immersion liquid is supplied relative to the upstream temperature sensor.

25 Claims, 5 Drawing Sheets

LITHOGRAPHIC APPARATUS AND DEVICE MANUFACTURING METHOD

This application claims priority and benefit under 35 U.S.C. §119(e) to U.S. Provisional Patent Application No. 61/136,273, entitled "Lithographic Apparatus and Device Manufacturing Method", filed on Aug. 22, 2008. The content of that application is incorporated herein in its entirety by reference.

FIELD

The present invention relates to a lithographic apparatus and a method for manufacturing a device. In particular, the device relates to an immersion lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The liquid is desirably distilled water, although other liquids can be used. An embodiment of the present invention will be described with reference to liquid. However, another fluid may be suitable, particularly a wetting fluid, an incompressible fluid and/or a fluid with a higher refractive index than air, desirably a higher refractive index than water. Fluids excluding gases are particularly desirable. The point of this is to enable imaging of smaller features since the exposure radiation will have a shorter wavelength in the liquid. (The effect of the liquid may be regarded as increasing the effective numerical aperture (NA) of the system and increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable are a hydrocarbon, such as an aromatic, e.g. Decalin, or a fluorohydrocarbon, or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

One of the solutions proposed is for a fluid handling system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT Patent Application Publication No. WO 99/49504. As illustrated in FIGS. 2 and 3, liquid is supplied by at least one inlet onto the substrate, desirably along the direction of movement of the substrate relative to the final element, and is removed by at least one outlet after having passed under the projection system. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

In European patent application publication no. EP 1420300 and United States patent application publication no. US 2004-0136494, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

SUMMARY

Controlling a property of the immersion liquid is very important in order to ensure that exposure of the substrate is consistent. In particular, accurate control of immersion liquid temperature is desired. This is because a property of the immersion liquid (for example, an optical property) can vary with temperature. In turn this property variation may affect the exposure of the substrate.

A thermal control unit can be used to regulate the immersion liquid temperature. However, in a conventional immersion lithographic apparatus, it is often not possible to put a thermal control unit in the vicinity of the point where accurate control of the temperature is desired. This can be due to, for example, space constraints in the proximity of the liquid supply system. Thus, the thermal control unit is placed at a remote location. The immersion liquid then has to be transported to the point of use i.e. to the point at which its one or more properties should be controlled. During transportation of the immersion liquid from the remote thermal control unit to the point of use, heat transfer to/from the immersion liquid can occur. The magnitude of this heat transfer is unknown. As such, the temperature of the immersion liquid at the point of use may not be controlled accurately, and thus a property of the immersion liquid may vary.

It is desirable, for example, to provide an apparatus and method for accurately controlling the temperature of immersion liquid at its point of use in an immersion lithographic apparatus.

According to an aspect of the invention, there is provided a fluid temperature control unit to control the temperature of a fluid at a fluid supply location in an immersion lithographic apparatus, the control unit comprising:

a first temperature sensor having a location and being configured to measure the temperature of the fluid at a position remote from the fluid supply location;

a second temperature sensor configured to measure the temperature of the fluid at the fluid supply location, and configured such that its calibration error relative to the first temperature sensor can be measured in situ; and a fluid transfer path configured to transfer the fluid from the location of the first temperature sensor to the supply location.

According to a further aspect of the invention, there is provided a temperature sensor calibration unit comprising:

a first temperature sensor;

a second temperature sensor whose calibration error relative to the first temperature sensor is to be determined, the second temperature sensor being remote from the first temperature sensor;

a calculation unit configured to calculate a calibration temperature error in the second temperature sensor relative to the first temperature sensor; and a mass flow rate controller configured to control a mass flow rate of the fluid in a fluid transfer path configured to transfer fluid from the first temperature sensor to the second temperature sensor.

According to a further aspect of the invention, there is provided a method of controlling the temperature of a fluid at a fluid supply location in an immersion lithographic apparatus, the method comprising:

measuring a temperature of the fluid at a location remote from the fluid supply location using a first temperature sensor;

transferring the fluid from the location of the first temperature sensor to the fluid supply location;

measuring a temperature of the fluid at the fluid supply location using a second temperature sensor; and calculating a temperature calibration error of the second temperature sensor relative to the first temperature sensor in situ.

According to a further aspect of the invention, there is provided a method of calculating a temperature calibration error of a second temperature sensor relative to a first temperature sensor, the method comprising:

measuring a temperature of a fluid using the first temperature sensor;

measuring a temperature of the fluid using the second temperature sensor, the fluid flowing between the first and second temperature sensors, and the second temperature sensor being located downstream of the first temperature sensor; and predicting a temperature difference between the temperature measured by the first temperature sensor and the temperature measured by the second temperature sensor at an infinite fluid mass flow rate, the predicted temperature difference being the temperature calibration error of the second temperature sensor.

According to a further aspect of the invention, there is provided a computer program to calculate a temperature calibration error of a second temperature sensor relative to a first temperature sensor, wherein, in use, a fluid flows between the first and second temperature sensors and the second temperature sensor is located downstream of the first temperature sensor, the computer program comprising instructions configured to predict, using temperature readings from the first and second temperature sensors, a temperature difference between the temperature measured by the first temperature sensor and the temperature measured by the second temperature sensor at an infinite fluid mass flow rate, the predicted temperature difference being the temperature calibration error.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
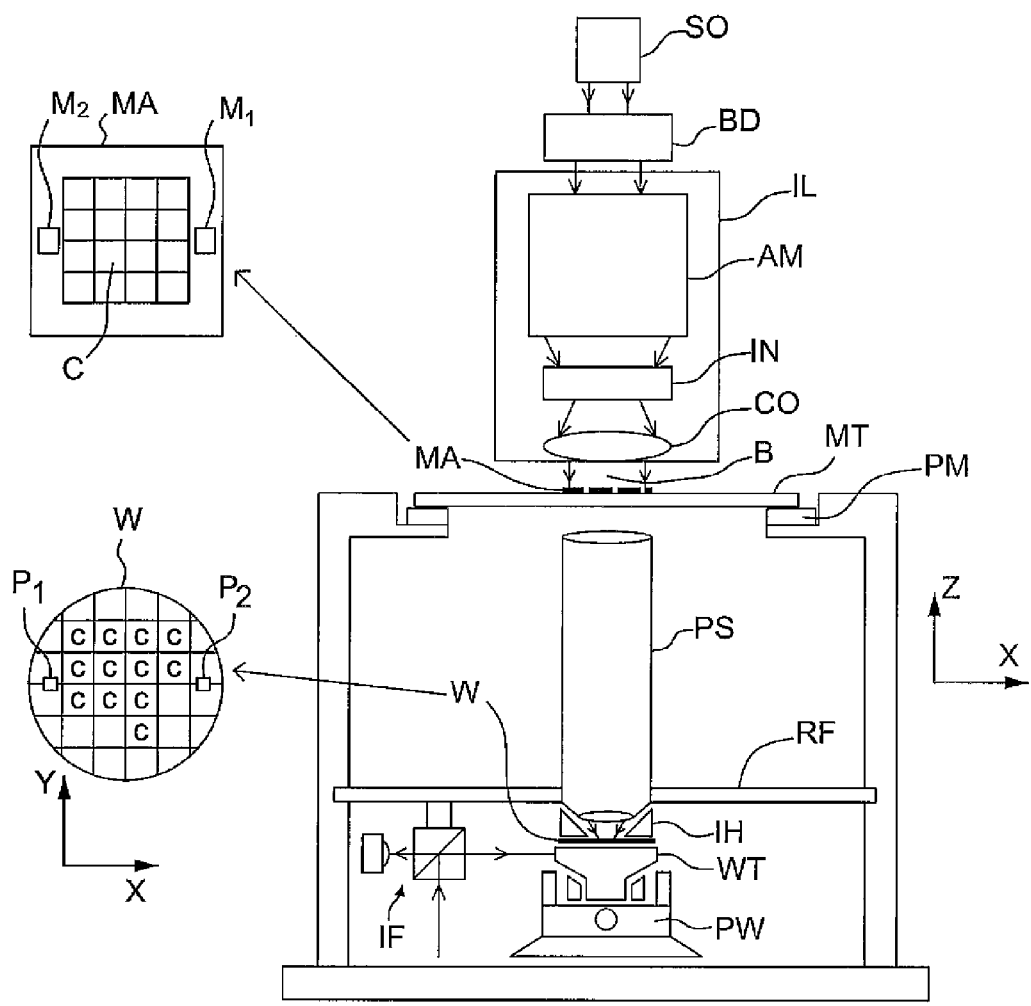
FIG. 1 depicts a lithographic apparatus according to an embodiment of the invention.
Figure 2:
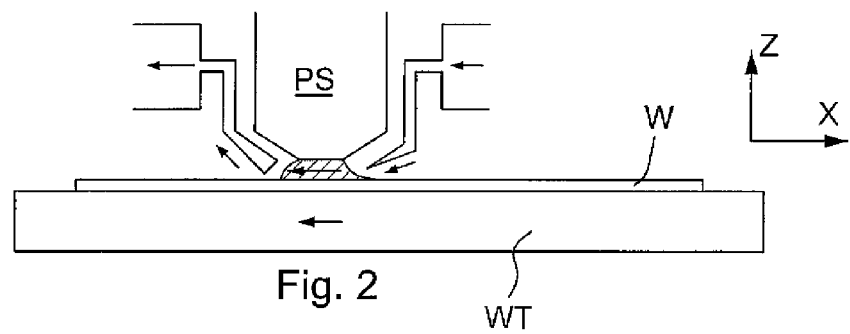
FIGS. 2 and 3 depict a fluid handling system for use in a lithographic projection apparatus.
Figure 3:
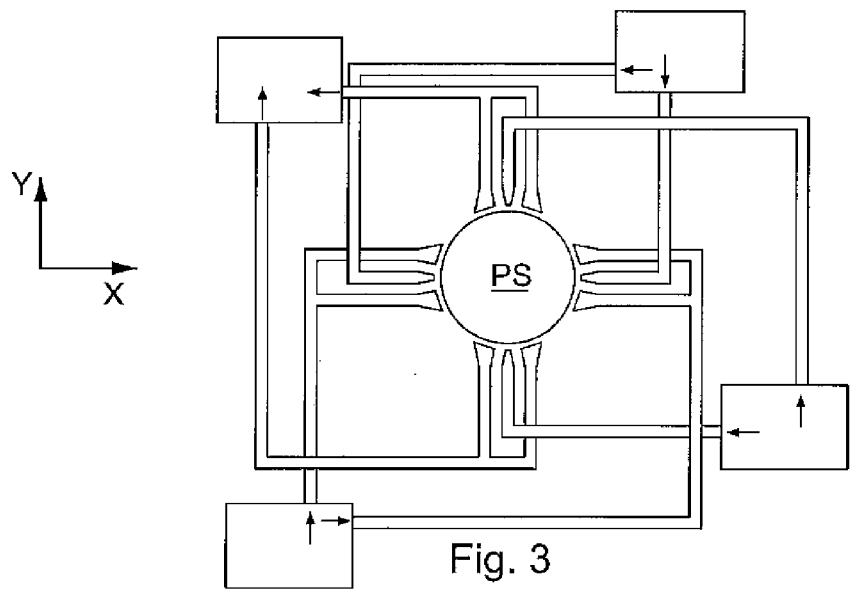

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
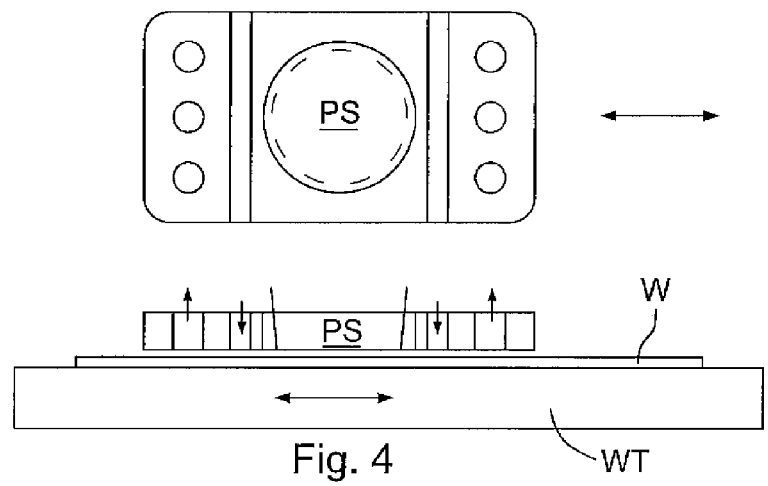
FIG. 4 depicts a further fluid handling system for use in a lithographic projection apparatus.

An immersion lithography apparatus with a localized fluid handling system is shown in FIG. 4. Liquid is supplied by two groove inlets on either side of the projection system PS and is removed by a plurality of discrete outlets arranged radially outwardly of the inlets. The inlets and outlets can be arranged in a plate with a hole in its centre and through which the projection beam is projected. Liquid is supplied by one groove inlet on one side of the projection system PS. Liquid is removed by a plurality of discrete outlets on the other side of the projection system PS. This causes a flow of a thin film of liquid between the projection system PS and the substrate W. The choice of which combination of inlet and outlets to use can depend on the direction of movement of the substrate W (the other combination of inlet and outlets being inactive).

Figure 5:
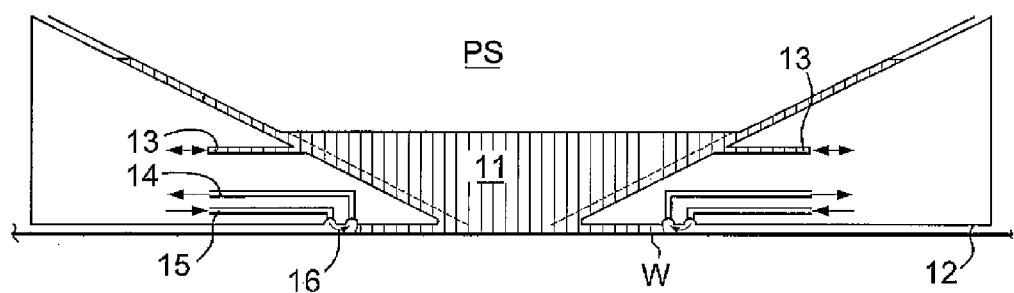
FIG. 5 depicts a further fluid handling system for use in a lithographic projection apparatus.

Another immersion lithography apparatus with a localized fluid handling system solution which has been proposed provides the fluid handling system with a barrier member (or so-called immersion hood IH). The barrier member can extend along at least a part of a boundary of the space between the final element of the projection system PS and the substrate table. Such an apparatus is illustrated in FIG. 5. The barrier member is substantially stationary relative to the projection system in the XY plane though there may be some relative movement in the Z direction (in the direction of the optical axis). A seal is formed between the barrier member and the surface of the substrate.

Referring to FIG. 5, barrier member 12 forms a contactless seal, such as a gas seal 16, to the substrate W around the image field of the projection system PS. Thus, immersion liquid is confined to fill an immersion space or reservoir 11 between the substrate surface W and the final element of the projection system PS. The reservoir 11 is formed by the barrier member 12 positioned below and surrounding the final element of the projection system PS. Liquid is brought into the space 11 below the projection system PS and within the barrier member 12. The barrier member 12 extends a little above the final element of the projection system PS and the liquid level rises above the final element so that a buffer of liquid is provided. The barrier member 12 has an inner periphery that at the upper end, in an embodiment, closely conforms to the shape of the projection system PS or the final element thereof. It may, e.g., be round. At the bottom, the inner periphery closely conforms to the shape of the image field, e.g., rectangular though this need not be the case.

In an embodiment, the liquid is confined in the reservoir 11 by the gas seal 16 between the bottom of the barrier member 12 and the surface of the substrate W. The gas seal 16 is formed by gas, e.g. air or synthetic air. In one embodiment, $N_2$ or another inert gas, is provided under pressure via inlet 15 to the gap between barrier member 12 and substrate W and extracted via first outlet 14. The overpressure on the gas inlet 15, vacuum level on the first outlet 14 and geometry of the gap are arranged so that there is a high-velocity gas flow inwards that confines the liquid. Such a system is disclosed in United States patent application publication no. US 2004-0207824.

As explained above, controlling the temperature of the immersion liquid that is used during immersion lithography is important.

Because of, for example, space constraints, the main thermal controller for the immersion liquid may not be located at the point at which the temperature of the immersion liquid needs to be controlled (also referred to herein as the "supply point"). The point at which the temperature of the immersion liquid should be controlled would typically be an immersion liquid inlet to a region where the immersion liquid is contained during exposure of a substrate. This could be, for example, any one of the inlets shown in FIG. 2, 3, 4 or 5. The supply point may be at an inlet to the so-called immersion hood IH.

The immersion liquid thus has to be transferred to, or transported from, the main thermal controller to the supply point. As explained above, heat transfer between the environment and the immersion liquid can occur during this transfer. Because the magnitude (and/or in some cases direction) of this heat transfer is not known, the temperature of the immersion liquid at the supply point may not be controlled with sufficient accuracy.

Figure 6:
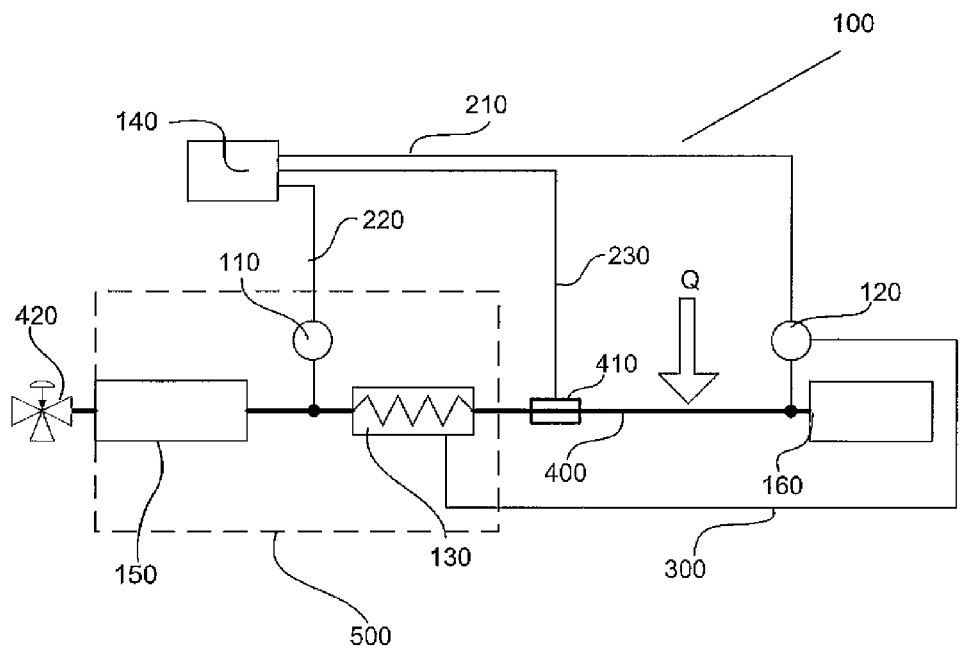
FIG. 6 depicts a fluid temperature control unit according to an embodiment of the present invention.

Referring to FIG. 6, fluid temperature control unit 100 is schematically depicted. In the fluid temperature control unit 100, a temperature sensor may be used to measure the temperature of the immersion liquid at the supply point 160. The temperature sensor can be sufficiently small that it can be provided at, very close to, or in the proximity of the fluid handling point 160 (i.e. the point where the temperature of the immersion liquid should be controlled) of a typical immersion lithographic apparatus. Desirably, the temperature sensor would be a Negative Temperature Coefficient (NTC) sensor. Such a sensor would desirably have an accuracy of at least as good as +/−1 mK. More desirably, the sensor would have an accuracy of at least as good as +/−0.5 mK. More desirably still, the sensor would have an accuracy of at least as good as +/−0.1 mK. Such a temperature sensor is shown in FIG. 6 as second temperature sensor 120 (a first temperature sensor 110 is also provided upstream of the second temperature sensor 120, as described below).

In the embodiment shown in FIG. 6, the second temperature sensor 120 can be used to provide a control signal 300 to a heater 130. The heater 130 provides heat input to the immersion fluid. The amount of heat input into the immersion fluid by the heater is dependent on the control signal 300 sent from the second temperature sensor 120. In this way, a feedback loop comprising the control signal 300 from the second temperature sensor 120 to the heater 130 can be used to help ensure that the heater 130 provides the correct amount of heat to the immersion fluid to keep its temperature at the supply point 160 at a desired level.

As shown in the embodiment of FIG. 6, the heater 130 can be provided in a remote, upstream location from the second temperature sensor 120. In many cases, the heater 130 has to be provided in a remote, upstream location from the second temperature sensor 120 because of space constraints. Thus, the heat supplied by the heater 130 is such that the temperature of the immersion liquid is at the desired level at the second temperature sensor 120 after it has been subjected to a heat transfer Q along the fluid transfer path 400. In an embodiment, the heater 130 could be provided at, near to, or in the proximity of the supply point 160.

The heat transfer Q can be heat transfer to or from the immersion liquid (i.e. it may be a positive or negative heat input) as it travels along the fluid transfer path 400. The heat transfer Q would typically be mostly due to convection in the environmental fluid (which would typically be air) surrounding the fluid transfer path 400. Such heat transfer Q would typically be dependent on the velocity of the environmental fluid relative to the immersion fluid ($V_{air}$) and the temperature difference between the immersion fluid and the environmental fluid ($T_{env}$).

In the embodiment shown in FIG. 6, the heater 130 is provided in a main thermal control unit 500 located upstream of the second temperature sensor 120. As discussed above, the main thermal control unit 500 is typically too large to be provided at the supply point 160. In the embodiment shown in FIG. 6, the main thermal control unit 500 also comprises a primary thermal controller 150. The primary thermal controller 150 can be used to provide approximate temperature control of the immersion liquid. As such, the primary thermal controller 150 can comprise a heater and/or an additional temperature sensor.

Typically, the temperature of the immersion liquid at exit from the primary thermal controller 150 is below the temperature that the immersion liquid should be at the exit from the heater 130 in order for it to be at the desired temperature at the supply point 160. This means that heat is always input to the immersion liquid by the heater 130 in order to provide accurate control of the immersion liquid temperature at the supply point 160. As explained above, the amount of heat input by heater 130 is then determined by the control signal 300. Typically, the heater 130 would raise the temperature of the immersion liquid by no more than 100 mK, although in some circumstances the heater 130 could raise the temperature of the immersion liquid by more than 100 mK. More typically, the heater 130 would raise the temperature of the immersion liquid by no more than 50 mK. More typically, the heater 130 would raise the temperature of the immersion liquid by no more than 30 mK. More typically, the heater 130 would raise the temperature of the immersion liquid by no more than 15 mK. In general, the thermal stability of the system improves if the thermal offset for which the heater 130 has to compensate is reduced.

Using the apparatus explained above in relation to FIG. 6, it is thus possible to maintain sufficiently accurate control of the temperature of immersion liquid, as measured by the second temperature sensor 120, in an immersion lithographic apparatus without having the main thermal control unit 500 at the supply point 160.

This system relies on the second temperature sensor 120 being accurately calibrated in order for the temperature of the immersion liquid itself to be controlled accurately. As explained above, typically, the second temperature sensor 120 would be an NTC sensor. Such a sensor is prone to sensor drift and/or electronic drift. To compensate for such drift, the second temperature sensor 120 should be recalibrated frequently. Typically, the second temperature sensor 120 and the first temperature sensor 110 are both precise, such that changes in the temperature difference measured between them should be accurate. However, the absolute temperature value measured by the second temperature sensor 120 may not be accurate if it is not accurately calibrated. Thus, the temperature calibration error of the second temperature sensor 120 relative to the first temperature sensor 110 is typically just a temperature offset.

Conventionally, a temperature sensor can be recalibrated by placing it into a large fluid bath along with another temperature sensor which is used as the calibration reference. However, in order to recalibrate the second temperature sensor 120 of the embodiment shown in FIG. 6 in this manner, the second temperature sensor 120 (and indeed the first temperature sensor 110) would need to be removed from the immersion lithographic apparatus. This would typically require the immersion lithographic apparatus to be shut down and opened. This would mean that the immersion lithographic apparatus could not be used for a period of time, and thus reduce the throughput of exposed substrates. It could also lead to contaminants and/or bacteria entering the immersion liquid. This would be undesirable as the immersion liquid needs to be ultra-pure, and so if any contaminants entered it, then this could lead to further downtime while the immersion fluid supply system is rinsed. In some cases, the calibration of a temperature sensor in a liquid bath may not remain valid when the sensor is returned to its measurement location.

According to an embodiment of the present invention, an apparatus and method is provided for checking the calibration error of the second temperature sensor 120 in situ. Thus, the calibration error of the second temperature sensor 120 can be established without having to remove it from its operating location. In an embodiment, the second temperature sensor 120 may be calibrated once its calibration error has been established. In an embodiment, calibration of the second temperature sensor 120 is not necessary.

According to an embodiment of the present invention, the calibration error of the second temperature sensor 120 can be measured relative to a first temperature sensor 110. As with the embodiment shown in FIG. 6, the first temperature sensor 110 can be provided upstream of the second temperature sensor 120. The first temperature sensor 110 may be provided in the main thermal control unit 500. It may be provided on the fluid supply path for the immersion liquid between the exit of the primary thermal controller 150 and the inlet to the heater 130. In an embodiment, the first temperature sensor 110 may be provided at another location, which need not necessarily be in the main thermal control unit 500. Desirably the first temperature sensor 110 is provided at a location that is easily accessible and/or at which it can be easily calibrated.

Figure 7:
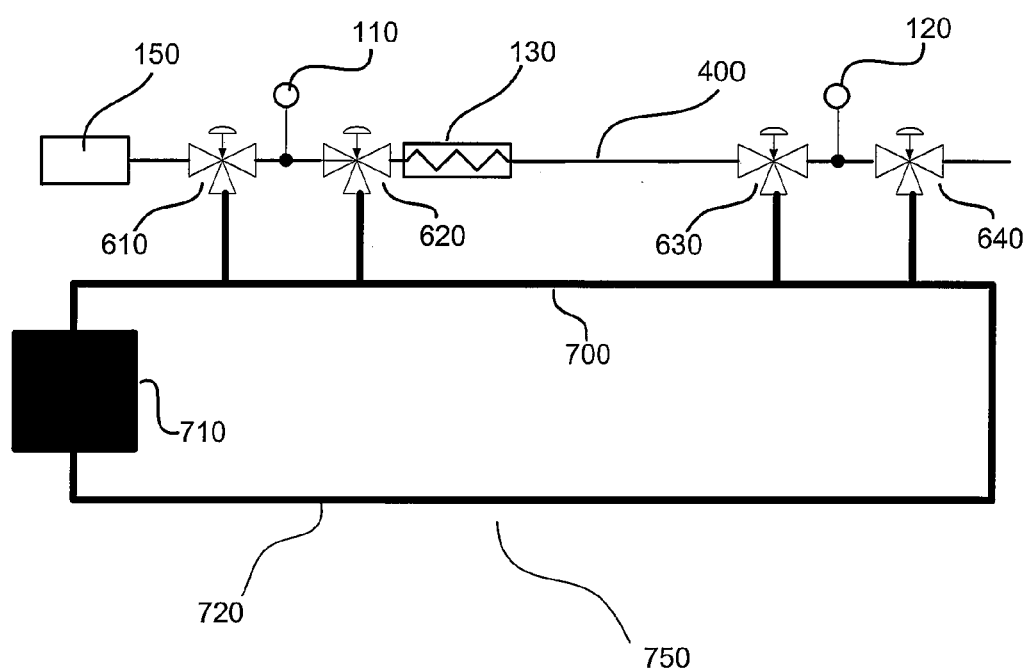
FIG. 7 depicts an apparatus to calibrate a second temperature sensor to a first temperature sensor using a calibration flow.

One technique for establishing the calibration error of the second temperature sensor 120 relative to the first temperature sensor 110 is to provide a separate calibration flow 700, as illustrated in FIG. 7. In the apparatus shown in FIG. 7, a separate calibration flow 700 is provided by a calibration fluid supply system 750. This separate flow 700 is independent of the immersion liquid flow. The calibration fluid supply system 750 can selectively provide a calibration flow to the first and second temperature sensors 110, 120. The calibration fluid supply system 750 can comprise a bulk calibration fluid tank 710 (which may also comprise a pump) and/or calibration flow pipes 720 in which the calibration flow 700 is transferred.

The separate calibration flow 700 can be selectively provided to the first and second temperature sensors 110, 120 to calibrate one or both of the temperature sensors 110, 120 using flow controllers 610, 620, 630, 640. The flow controllers 610, 620, 630, 640 can be arranged selectively to provide the first and second temperature sensors 110, 120 with the calibration flow 700 when the calibration error of the second temperature sensor 120 relative to the first temperature sensor 110 is being measured. The flow controllers 610, 620, 630, 640 can be further arranged selectively to provide the first and second temperature sensors 110, 120 with the immersion fluid whose temperature is being controlled by the fluid temperature control unit 100 when the calibration error of the second temperature sensor 120 relative to the first temperature 110 sensor is not being measured.

The calibration flow 700 can be much more thermally stable than the immersion liquid flow. This can be achieved by arranging the calibration fluid supply system 750 to have, for example, a very high mass flow rate, and/or highly insulated pipes 720 to transfer the calibration flow 700. Thus, although some heat transfer to/from the calibration flow 700 from the environment may occur in practice, the amount of heat transfer can be made to be substantially negligible. Thus, the heat transfer to the calibration flow 700 between the first and second temperature sensors 110, 120 can be less than heat transfer to the immersion fluid whose temperature is being controlled by the fluid temperature control unit 100 between the first and second temperature sensors 110, 120. Additionally or alternatively, the temperature change of the calibration flow 700 between the first and second temperature sensors 110, 120 due to heat transfer can be less than the temperature change of the immersion fluid whose temperature is being controlled by the fluid temperature control unit 100 between the first and second temperature sensors 110, 120 due to heat transfer.

As such, the calibration error of the second temperature sensor 120 relative to the first temperature sensor 110 can be calculated simply as the difference between the readings of the two sensors 110, 120. In other words, if the two temperature sensors 110, 120 were calibrated to each other perfectly, then they should give the same temperature reading for the bulk flow.

In an embodiment, a fluid temperature control unit 100 comprises a calculation unit 140 used to calibrate the second temperature sensor 120 relative to the first temperature sensor 110, or to determine the calibration error in the second temperature sensor 120 relative to the first temperature sensor 110. Such a calculation unit is shown in FIG. 6. In this embodiment, no separate calibration flow is required.

In the embodiment comprising a calculation unit 140, shown in FIG. 6, there is no requirement for extra tubing for a calibration flow, and no requirement for a pump system for the calibration flow. This means that an embodiment such as that shown in FIG. 6 can be made compact and/or at low cost. The embodiment shown in FIG. 6, which comprises a calculation unit 140 but no specific calibration flow, also avoids dynamic crossing of the pipes with the metrology frame RF. This can help to avoid transmission of unwanted temperature variations and/or vibrations to the metrology frame RF.

The calculation unit 140 has as inputs the temperature 210 as measured by the second temperature sensor 120, the temperature 220 as measured by the first temperature sensor 110, and the mass flow rate 230 of the immersion liquid as measured by mass flow rate sensor 410. It uses these inputs to theoretically predict the calibration error of the second temperature sensor 120 relative to the first temperature sensor 110. Optionally, the calculation unit 140 can then calibrate the second temperature sensor 120 to the first temperature sensor 110. The theory used by the calculation unit 140 is explained below.

The actual temperature difference (ΔT) created between two points in the immersion liquid flow due to convection heat transfer can be modeled as:

$$\Delta T = \frac{Q(T_{env}, V_{air})}{\dot{m} c_p} + \Delta T_{dP}(\dot{m}) \quad (1)$$

Where:
Q=heat transfer to (or from) the immersion liquid due to convection [W]
$\dot{m}$=mass flow rate of the immersion liquid [kg/s]
$c_p$=specific heat capacity of the immersion liquid [J/(kg*K)]
$\Delta T_{dP}(\dot{m})$ increase in immersion liquid temperature due to pressure drop between the two points [K]

As shown in Equation 1 above, the heat transfer (Q) to the immersion fluid is a function of the difference in temperature between the immersion fluid and the surrounding environment (typically air) ($T_{env}$), and the velocity of the surrounding environment relative to the immersion liquid flow ($V_{air}$).

The term $\Delta T_{dP}(\dot{m})$ represents the change in immersion liquid temperature due to pressure drop between the two points. This term is a known function of the flow velocity. As such, it can easily be calculated for a given mass flow rate. Thus, the temperature change due to this term can be accounted for in Equation 1 if the mass flow rate (and thus flow velocity) is known.

Figure 8:
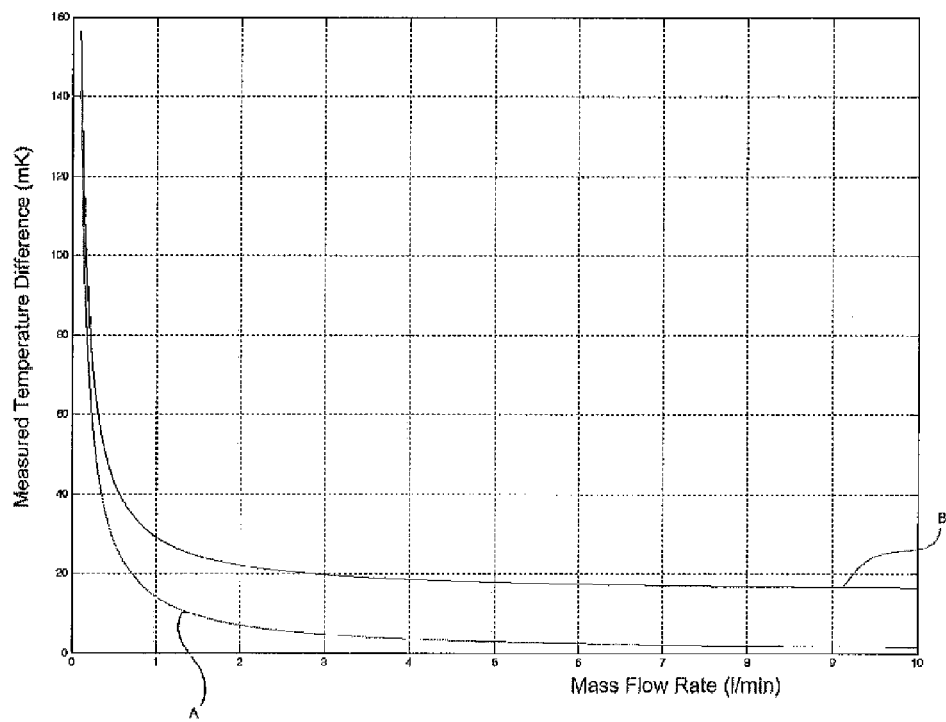
FIG. 8 shows a graph of temperature difference measured by two sensors at different points along a flow path of immersion liquid versus mass flow rate of the immersion liquid.

FIG. 8 is a graph showing temperature difference between two points versus mass flow rate of an immersion liquid, with the $\Delta T_{dP}(\dot{m})$ term taken into account (i.e. the temperature difference on the y-axis is the temperature difference between the two points excluding the $\Delta T_{dP}(\dot{m})$ term). The two points in the immersion fluid flow between which the measured temperature difference is plotted are at the first temperature sensor 110 and the second temperature sensor 120. Curve A shows a plot of temperature difference (excluding the $\Delta T_{dP}(\dot{m})$ term) between the first temperature sensor 110 and the second temperature sensor 120 (ΔT) versus mass flow rate of the immersion liquid flow using the above equation for suitable values of $c_p$ and Q. As can be seen from curve A, as the mass flow rate approaches infinity, the temperature difference tends to zero. This is because the $\Delta T_{dP}(\dot{m})$ term on the right hand side of Equation 1 has been taken into account (because the flow velocity is known), and Q tends to zero. Thus, curve A would be generated using values from the first and second temperature sensors 110, 120 in Equation 1 if the first and second temperature sensors 110, 120 were calibrated to each other correctly.

However, due to a calibration error in the second temperature sensor 120 relative to the first temperature sensor 110, Equation 1 becomes Equation 2 below:

$$\Delta T(\text{measured}) = \frac{Q(T_{env}, V_{air})}{\dot{m} c_p} + \Delta T_{dP}(\dot{m}) + C_{drift} \quad (2)$$

Where:
$C_{drift}$=calibration temperature error of the second temperature sensor 120 relative to the first temperature sensor 110.

Curve B in FIG. 8 shows how the measured temperature difference (excluding the $\Delta T_{dP}(\dot{m})$ term) between the first and second temperature sensors 110, 120 varies with mass flow rate if there is a calibration error ($C_{drift}$) in the second temperature sensor 120 relative to the first temperature sensor 110. In the example shown by curve B, the calibration error ($C_{drift}$) is about 15 mK.

Because Q tends to zero as the mass flow rate tends to infinity, and the temperature difference due to pressure drop ($\Delta T_{dP}(\dot{m})$) is already taken into account in the curves of FIG. 8, the plotted temperature difference between the two temperature sensors tends to the calibration error value of the second temperature sensor 120 as the mass flow rate tends to infinity.

Using the above theory, the calculation unit 140 estimates the temperature difference between the two temperature sensors 110, 120 as the mass flow rate tends to infinity, thereby establishing the calibration temperature error in the second temperature sensor 120 relative to the first temperature sensor 110. It will be understood that, as referred to herein, the predicted, or estimated, theoretical temperature difference that would be measured between the first and second temperature sensors 110, 120 at an infinite fluid mass flow rate can mean the predicted theoretical temperature difference between the two sensors 110, 120 after taking the temperature difference due to pressure drop into account (i.e. with the $\Delta T_{dP}(\dot{m})$ term subtracted).

In a typical embodiment, the calculation unit 140 receives the two temperature inputs and the mass flow rate input at two different mass flow rates of the immersion liquid. The mass flow rate of the immersion liquid can be varied using a flow rate controller 420 shown in FIG. 6. Taking the temperature difference between the first and second temperature sensors 110, 120 at these two different, known, flow rates enables the calculation unit 140 to generate a curve of temperature difference between the two sensors versus mass flow rate (curve B in FIG. 8) even though the heat transfer Q to the immersion liquid is not known. For example, if the calculation unit 140 knows the general form of the curve (for example from a control curve generated for the system under controlled conditions with accurately calibrated sensors), then a least squares fitting model can be used to generate the precise curve from the two readings. For example, a Nelder-Mead method could be used. Once the precise curve has been generated, the calculation unit 140 can readily determine what the temperature difference between the two temperature sensors 110, 120 at an infinite mass flow rate would be. This temperature difference is then taken to be the calibration error of the second temperature sensor 120 relative to the first temperature sensor 110.

Once this temperature calibration error is known, the amount of heat input to the immersion liquid by the heater 130, as instructed by control signal 300, can be modified accordingly. Optionally, a separate control unit (not shown in the Figures) can be provided between the second temperature sensor 120 and the heater 130 in order to generate the control signal 300 from the output of the second temperature sensor 120.

Alternatively or additionally, the second temperature sensor 120 could be calibrated to the first temperature sensor 110, for example, using the calculation unit 140. In this case, the second temperature sensor 120 and the first temperature sensor 110 would give the same temperature reading for a given fluid at a particular position and at a particular time. Thus, no modification of the control signal 300 input to the heater 130 would be required. If the second temperature sensor 120 were calibrated to the first temperature sensor 110, then the temperature difference between the two sensors 110, 120 could be used directly in determining the amount of heat required to be input to the immersion liquid using the heater 130.

In an embodiment, it may be possible for the calculation unit 140 to determine the temperature calibration error of the second temperature sensor 120 using the measured temperature difference between the two temperature sensors 110, 120 at a single mass flow rate. This could be possible if, for example, a heat transfer model were used to estimate the value of the heat transfer Q to the immersion liquid along path 400.

Using the apparatus and method described above in relation to FIG. 6 to determine the calibration error of the second temperature sensor 120 relative to the first temperature sensor 110 has one or more advantages. For example, there may be no need to physically remove the second temperature sensor 120 (or indeed the first temperature sensor 110) from the system. This reduces the down time of the immersion lithographic apparatus, and also reduces the likelihood of contaminants and/or bacteria entering the immersion liquid. Indeed, because the calibration measurements are performed using the immersion fluid itself, the flow of immersion fluid does not need to be interrupted during calibration.

Additionally or alternatively, if a single sensor breaks, then just that one sensor needs to be replaced, rather than all of the sensors as would be the case with conventional thermal control techniques. Moreover, because no separate calibration flow is required in the embodiment of FIG. 6, any chance that contaminants and/or bacteria may enter the immersion liquid from the calibration fluid is eliminated.

Typically, the temperature calibration error of the second temperature sensor 120 relative to the first temperature sensor 110 after calibrating the second temperature sensor 120 using the apparatus and method described above in relation to FIG. 6 would be +/−5 mK. More typically, the temperature calibration error of the second temperature sensor 120 relative to the first temperature sensor 110 after calibrating the second temperature sensor 120 using the apparatus and method described above in relation to FIG. 6 would be +/−4 mK. More typically still, the temperature calibration error of the second temperature sensor 120 relative to the first temperature sensor 110 after calibrating the second temperature sensor 120 using the apparatus and method described above in relation to FIG. 6 would be +/−2 mK.

While embodiments have been described with respect to using a heater 130, an embodiment may have a cooler 130 or a combination of heater and cooler 130.

In an aspect, there is provided a fluid temperature control unit to control the temperature of a fluid at a fluid supply location in an immersion lithographic apparatus, the control unit comprising a first temperature sensor having a location and being configured to measure the temperature of the fluid at a position remote from the fluid supply location, a second temperature sensor configured to measure the temperature of the fluid at the fluid supply location, and configured such that its calibration error relative to the first temperature sensor can be measured in situ, and a fluid transfer path configured to transfer the fluid from the location of the first temperature sensor to the supply location. Optionally, the fluid temperature control unit further comprises a calculation unit configured to calculate a calibration temperature error in the second temperature sensor using a difference in measured temperatures between the first and second temperature sensors at least two different, known, mass flow rates. Optionally, the fluid temperature control unit further comprises a mass flow rate sensor configured to measure the mass flow rate of the fluid between the first and second temperature sensors. Optionally, the calculation unit is configured to calculate the calibration temperature error by predicting the theoretical temperature difference that would be measured between the first and second temperature sensors at an infinite fluid mass flow rate using the difference in the measured temperatures at the at least two different flow rates, the predicted theoretical temperature difference being the calibration temperature error. Optionally, the calculation unit is configured to use the difference in the measured temperatures at the at least two different flow rates to generate a curve of temperature difference between the first and second temperature sensors versus fluid mass flow rate using the equation:

$$\Delta T = \frac{Q(T_{env}, V_{air})}{\dot{m} c_p} + \Delta T_{dP}(\dot{m})$$

where Q=heat transfer to (or from) the fluid along the fluid transfer path due to convection [W]; $\dot{m}$=mass flow rate of the fluid [kg/s]; $c_p$=specific heat capacity of the fluid [J/(kg*K)]; $\Delta T_{dP}(\dot{m})$=increase in fluid temperature due to pressure drop between the first temperature sensor and the second temperature sensor [K], the calculation unit using the generated curve to predict the theoretical temperature difference at an infinite fluid mass flow rate. Optionally, the curve of temperature difference between the first and second temperature sensors versus fluid mass flow rate is generated using a least squares fitting model. Optionally, the heat transfer to the immersion fluid due to convection (Q) is unknown and is a function of (i) the temperature difference between the immersion fluid and the surrounding environment ($T_{env}$), and (ii) the velocity of the surrounding environmental fluid relative to the velocity of the immersion fluid ($V_{air}$). Optionally, the second temperature sensor is located at the supply location, and the first temperature sensor is located at a remote, upstream position from the supply location. Optionally, the fluid temperature control unit further comprises a calibration fluid supply system to selectively provide a calibration flow to the first and second temperature sensors in order to calculate the calibration error, wherein the calibration flow provided by the calibration fluid supply system is independent of the fluid whose temperature is being controlled by the fluid temperature control unit. Optionally, the calibration fluid supply system is configured such that heat transfer to the calibration flow between the first and second temperature sensors is less than heat transfer to the fluid whose temperature is being controlled by the fluid temperature control unit between the first and second temperature sensors. Optionally, the calibration fluid supply system is configured such that temperature change of the calibration flow between the first and second temperature sensors due to heat transfer is less than temperature change of the fluid whose temperature is being controlled by the fluid temperature control unit between the first and second temperature sensors due to heat transfer. Optionally, the calibration fluid supply system is configured such that the temperature change of the calibration flow between the first and second temperature sensors due to heat transfer is substantially negligible. Optionally, the fluid temperature control unit further comprises a flow controller arranged selectively to provide the first and second temperature sensors with (i) calibration flow when the calibration error of the second temperature sensor relative to the first temperature sensor is being measured, and (ii) the fluid whose temperature is being controlled by the fluid temperature control unit when the calibration error of the second temperature sensor relative to the first temperature sensor is not being measured. Optionally, the first and second temperature sensors are Negative Temperature Coefficient (NTC) temperature sensors with an accuracy of within 0.1 mK. Optionally, the fluid temperature control unit further comprises a heater configured to provide sufficient heat to raise the temperature of the fluid as measured by the second temperature sensor to a desired temperature. Optionally, the heater is provided at a remote, upstream location from the second temperature sensor. Optionally, the fluid temperature control unit further comprises a primary thermal controller located upstream of the heater and configured to set the temperature of the fluid at its exit to a lower level than that required for the temperature of the fluid at the second temperature sensor to be at the desired level. Optionally, the fluid supplied to the fluid supply location is an immersion liquid for use in immersion lithography.

In an aspect, there is provided an immersion lithographic apparatus comprising a fluid handling system configured to supply, at least partly confine, and/or remove immersion liquid during exposure of the substrate, and the above fluid temperature control unit, wherein the fluid temperature control unit is configured to control the temperature of the immersion liquid in the fluid handing system. Optionally, the fluid supply location, at which the second temperature sensor is configured to measure the fluid temperature, is at a supply location of the fluid handling system.

In an aspect, there is provided an immersion lithographic apparatus comprising an illumination optical system arranged to illuminate a pattern, a projection optical system arranged to project an image of the pattern onto a substrate to expose the substrate, a fluid handling system configured to supply, at least partly confine, and/or remove immersion liquid to at least the portion of the substrate being exposed, and the above fluid temperature control unit, wherein the fluid temperature control unit is configured to control the temperature of the immersion liquid in the fluid handing system.

In an aspect, there is provided a temperature sensor calibration unit comprising a first temperature sensor, a second temperature sensor whose calibration error relative to the first temperature sensor is to be determined, the second temperature sensor being remote from the first temperature sensor, a calculation unit configured to calculate a calibration temperature error in the second temperature sensor relative to the first temperature sensor, and a mass flow rate controller configured to control a mass flow rate of the fluid in a fluid transfer path configured to transfer fluid from the first temperature sensor to the second temperature sensor. Optionally, the calibration unit is configured to calculate the calibration temperature error by setting the mass flow rate of the fluid in the fluid transfer path using the mass flow rate controller to at least two different values, measuring the difference in temperatures between the first and second temperature sensors at the at least two different flow rates, and predicting, using the calculation unit, a theoretical temperature difference that would be measured between the first and second temperature sensors at an infinite fluid mass flow rate using the difference in measured temperatures between the first and second temperature sensors at the at least two flow rates, the predicted theoretical temperature difference being the calibration temperature error.

In an aspect, there is provided a method of controlling the temperature of a fluid at a fluid supply location in an immersion lithographic apparatus, the method comprising measuring a temperature of the fluid at a location remote from the fluid supply location using a first temperature sensor, transferring the fluid from the location of the first temperature sensor to the fluid supply location, measuring a temperature of the fluid at the fluid supply location using a second temperature sensor, and calculating a temperature calibration error of the second temperature sensor relative to the first temperature sensor in situ. Optionally, calculating the temperature calibration error comprises predicting a theoretical temperature difference that would be measured between the first and second temperature sensors at an infinite fluid mass flow rate, the predicted theoretical temperature difference being the calibration temperature error. Optionally, predicting the theoretical temperature difference comprises using a difference in measured temperatures between the first and second sensors at least two different, known, flow rates to generate a curve of temperature difference between the first and second temperature sensors versus fluid mass flow rate using the equation:

$$\Delta T = \frac{Q(T_{env}, V_{air})}{\dot{m}c_p} + \Delta T_{dP}(\dot{m})$$

where Q=heat transfer to (or from) the fluid along the fluid transfer path due to convection [W]; $\dot{m}$=mass flow rate of the fluid [kg/s]; $c_p$=specific heat capacity of the fluid [J/(kg*K)]; $\Delta T_{dP}(\dot{m})$=increase in fluid temperature due to pressure drop between the first temperature sensor and the second temperature sensor [K]. Optionally, the method further comprises heating the fluid so as to raise the temperature of the fluid as measured by the second temperature sensor to a desired temperature. Optionally, heating the fluid is performed at a location remote from, and upstream of, the second temperature sensor.

In an aspect, there is provided a method of calculating a temperature calibration error of a second temperature sensor relative to a first temperature sensor, the method comprising measuring a temperature of a fluid using the first temperature sensor, measuring a temperature of the fluid using the second temperature sensor, the fluid flowing between the first and second temperature sensors, and the second temperature sensor being located downstream of the first temperature sensor, and predicting a temperature difference between the temperature measured by the first temperature sensor and the temperature measured by the second temperature sensor at an infinite fluid mass flow rate, the predicted temperature difference being the temperature calibration error of the second temperature sensor. Optionally, predicting the temperature difference comprises calculating a difference between the temperature measured using the first temperature sensor and the temperature measured using the second temperature sensor at a first mass flow rate, calculating a difference between the temperature measured using the first temperature sensor and the temperature measured using the second temperature sensor at a second mass flow rate that is different to the first mass flow rate, and generating a curve of temperature difference between the first and second temperature sensors versus fluid mass flow rate using the calculated temperature differences at the first and second mass flow rates.

In an aspect, there is provided a computer program to calculate a temperature calibration error of a second temperature sensor relative to a first temperature sensor, wherein, in use, a fluid flows between the first and second temperature sensors and the second temperature sensor is located downstream of the first temperature sensor, the computer program comprising instructions configured to predict, using temperature readings from the first and second temperature sensors, a temperature difference between the temperature measured by the first temperature sensor and the temperature measured by the second temperature sensor at an infinite fluid mass flow rate, the predicted temperature difference being the temperature calibration error. Optionally, the computer program comprises instructions configured to predict the temperature difference by calculating a difference between the temperature measured using the first temperature sensor and the temperature measured using the second temperature sensor at a first mass flow rate, calculating a difference between the temperature measured using the first temperature sensor and the temperature measured using the second temperature sensor at a second mass flow rate that is different to the first mass flow rate, and generating a curve of temperature difference between the first and second temperature sensors versus fluid mass flow rate using the calculated temperature differences at the first and second mass flow rates.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of one or more computer programs containing one or more sequences of machine-readable instructions describing a method as disclosed above, or one or more data storage medium (e.g. semiconductor memory, magnetic or optical disk) having such one or more computer program stored therein. The one or more different controllers referred to herein may be operable when the one or more computer programs are read by one or more computer processors located within at least one component of the lithographic apparatus. One or more processors are configured to communicate with the at least one of the controllers; thereby the controller(s) operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the fluid handling system may not confine the immersion fluid or it may provide a proportion of immersion liquid confinement, but not substantially complete confinement of the immersion liquid.

In an immersion apparatus, immersion liquid is handled by a fluid handling system or apparatus. In an embodiment the fluid handling system may supply immersion fluid and therefore be a fluid supply system. In an embodiment the fluid handling system may confine fluid and thereby be a fluid confinement system. If the confined fluid is a liquid, the fluid confinement system may have a liquid confinement structure. In an embodiment the fluid handling system may provide a barrier to fluid and thereby be a barrier member. In an embodiment the fluid handling system may create or use a flow of fluid (such as gas), for example to help in handling liquid such as to confine liquid for example as a contactless gas seal. In an embodiment, immersion liquid may be used as the immersion fluid. In that case, the fluid handling system may be a liquid handling system.

A fluid handling system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The fluid handling system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A fluid temperature control unit to control the temperature of a fluid at a fluid supply location in an immersion lithographic apparatus, the control unit comprising:
a first temperature sensor having a location and being configured to measure the temperature of the fluid at a position remote from the fluid supply location;
a second temperature sensor configured to measure the temperature of the fluid at the fluid supply location, and configured such that its calibration error relative to the first temperature sensor can be measured in situ;
a fluid transfer path configured to transfer the fluid from the location of the first temperature sensor to the fluid supply location; and
a calculation unit configured to calculate a calibration temperature error in the second temperature sensor using a difference in measured temperatures between the first and second temperature sensors at at least two different, known, mass flow rates.

2. The fluid temperature control unit of claim 1, further comprising a mass flow rate sensor configured to measure the mass flow rate of the fluid between the first and second temperature sensors.

3. The fluid temperature control unit of claim 1, wherein the calculation unit is configured to calculate the calibration temperature error by predicting the theoretical temperature difference that would be measured between the first and second temperature sensors at an infinite fluid mass flow rate using the difference in the measured temperatures at the at least two different flow rates, the predicted theoretical temperature difference being the calibration temperature error.

4. The fluid temperature control unit of claim 3, wherein the calculation unit is configured to use the difference in the measured temperatures at the at least two different flow rates to generate a curve of temperature difference between the first and second temperature sensors versus fluid mass flow rate using the equation:

$$\Delta T = \frac{Q(T_{env}, V_{air})}{\dot{m} c_p} + \Delta T_{dP}(\dot{m})$$

where:
Q=heat transfer to (or from) the fluid along the fluid transfer path due to convection [W]
$\dot{m}$=mass flow rate of the fluid [kg/s]
$c_p$=specific heat capacity of the fluid [J/(kg*K)]
$\Delta T_{dP}(\dot{m})$=increase in fluid temperature due to pressure drop between the first temperature sensor and the second temperature sensor [K],
the calculation unit using the generated curve to predict the theoretical temperature difference at an infinite fluid mass flow rate.

5. The fluid temperature control unit of claim 4, wherein the curve of temperature difference between the first and second temperature sensors versus fluid mass flow rate is generated using a least squares fitting model.

6. The fluid temperature control unit of claim 4, wherein the heat transfer to the immersion fluid due to convection (Q) is unknown and is a function of:
i) the temperature difference between the immersion fluid and the surrounding environment ($T_{env}$); and
ii) the velocity of the surrounding environmental fluid relative to the velocity of the immersion fluid ($V_{air}$).

7. The fluid temperature control unit of claim 1, wherein:
the second temperature sensor is located at the fluid supply location; and
the first temperature sensor is located at a remote, upstream position from the fluid supply location.

8. The fluid temperature control unit of claim 1, further comprising a calibration fluid supply system to selectively provide a calibration flow to the first and second temperature sensors in order to calculate the calibration error, wherein the calibration flow provided by the calibration fluid supply system is independent of the fluid whose temperature is being controlled by the fluid temperature control unit.

9. The fluid temperature control unit of claim 8, wherein the calibration fluid supply system is configured such that heat transfer to the calibration flow between the first and second temperature sensors is less than heat transfer to the fluid whose temperature is being controlled by the fluid temperature control unit between the first and second temperature sensors.

10. The fluid temperature control unit of claim 8, wherein the calibration fluid supply system is configured such that temperature change of the calibration flow between the first and second temperature sensors due to heat transfer is less than temperature change of the fluid whose temperature is being controlled by the fluid temperature control unit between the first and second temperature sensors due to heat transfer.

11. The fluid temperature control unit of claim 8, wherein the calibration fluid supply system is configured such that the temperature change of the calibration flow between the first and second temperature sensors due to heat transfer is substantially negligible.

12. The fluid temperature control unit of claim 8, further comprising a flow controller arranged selectively to provide the first and second temperature sensors with (i) calibration flow when the calibration error of the second temperature sensor relative to the first temperature sensor is being measured, and (ii) the fluid whose temperature is being controlled by the fluid temperature control unit when the calibration error of the second temperature sensor relative to the first temperature sensor is not being measured.

13. The fluid temperature control unit of claim 1, wherein the first and second temperature sensors are Negative Temperature Coefficient (NTC) temperature sensors with an accuracy of within 0.1 mK.

14. The fluid temperature control unit of claim 1, further comprising a heater configured to provide sufficient heat to raise the temperature of the fluid as measured by the second temperature sensor to a desired temperature.

15. The fluid temperature control unit of claim 14, wherein the heater is provided at a remote, upstream location from the second temperature sensor.

16. The fluid temperature control unit of claim 14, further comprising a primary thermal controller located upstream of the heater and configured to set the temperature of the fluid at its exit to a lower level than that required for the temperature of the fluid at the second temperature sensor to be at the desired level.

17. The fluid temperature control unit of claim 1, wherein the fluid supplied to the fluid supply location is an immersion liquid for use in immersion lithography.

18. An immersion lithographic apparatus comprising:
a projection optical system arranged to project an image of a pattern onto a substrate to expose the substrate;
a fluid handling system configured to supply immersion liquid to, at least partly confine immersion liquid to, and/or remove immersion liquid from, at least a portion of the substrate being exposed; and
a fluid temperature control unit configured to control the temperature of the immersion liquid in the fluid handling system at a fluid supply location, the control unit comprising:
a first temperature sensor having a location and being configured to measure the temperature of the fluid at a position remote from the fluid supply location,
a second temperature sensor configured to measure the temperature of the fluid at the fluid supply location, and configured such that its calibration error relative to the first temperature sensor can be measured in situ,
a fluid transfer path configured to transfer the fluid from the location of the first temperature sensor to the fluid supply location, and
a calculation unit configured to calculate a calibration temperature error in the second temperature sensor using a difference in measured temperatures between the first and second temperature sensors at at least two different, known, mass flow rates.

19. The immersion lithographic apparatus of claim 18, wherein the fluid supply location, at which the second temperature sensor is configured to measure the fluid temperature, is at a fluid supply location of the fluid handling system.

20. The immersion lithographic apparatus of claim 18, wherein the calculation unit is configured to calculate the calibration temperature error by predicting the theoretical temperature difference that would be measured between the first and second temperature sensors at an infinite fluid mass flow rate using the difference in the measured temperatures at the at least two different flow rates, the predicted theoretical temperature difference being the calibration temperature error.

21. A method of controlling the temperature of a fluid at a fluid supply location in an immersion lithographic apparatus, the method comprising:
measuring a temperature of the fluid at a location remote from the fluid supply location using a first temperature sensor;
transferring the fluid from the location of the first temperature sensor to the fluid supply location;
measuring a temperature of the fluid at the fluid supply location using a second temperature sensor; and
calculating a temperature calibration error of the second temperature sensor relative to the first temperature sensor in situ using a difference in measured temperatures between the first and second temperature sensors at at least two different, known, mass flow rates.

22. The method of claim 21, wherein calculating the temperature calibration error comprises predicting a theoretical temperature difference that would be measured between the first and second temperature sensors at an infinite fluid mass flow rate, the predicted theoretical temperature difference being the calibration temperature error.

23. The method of claim 22, wherein predicting the theoretical temperature difference comprises using the difference in measured temperatures between the first and second sensors at at least two different, known, flow rates to generate a curve of temperature difference between the first and second temperature sensors versus fluid mass flow rate using the equation:

$$\Delta T = \frac{Q(T_{env}, V_{air})}{\dot{m} c_p} + \Delta T_{dP}(\dot{m})$$

where:
Q=heat transfer to (or from) the fluid along the fluid transfer path due to convection [W]
$\dot{m}$=mass flow rate of the fluid [kg/s]
$c_p$=specific heat capacity of the fluid [J/(kg*K)]
$\Delta T_{dP}(\dot{m})$=increase in fluid temperature due to pressure drop between the first temperature sensor and the second temperature sensor [K].

24. The method of claim 21, further comprising heating the fluid so as to raise the temperature of the fluid as measured by the second temperature sensor to a desired temperature.

25. The method of claim 24, wherein heating the fluid is performed at a location remote from, and upstream of, the second temperature sensor.

* * * * *